(12) United States Patent
Nunes

(10) Patent No.: US 8,493,108 B2
(45) Date of Patent: Jul. 23, 2013

(54) SYNCHRONIZER WITH HIGH RELIABILITY

(75) Inventor: Lincoln R. Nunes, Austin, TX (US)

(73) Assignee: Apple Inc., Cupertino, CA (US)

(*) Notice: Subject to any disclaimer, the term of this patent is extended or adjusted under 35 U.S.C. 154(b) by 56 days.

(21) Appl. No.: 13/235,297

(22) Filed: Sep. 16, 2011

(65) Prior Publication Data

US 2013/0069697 A1  Mar. 21, 2013

(51) Int. Cl.
*H03L 7/00* (2006.01)

(52) U.S. Cl.
USPC .......................................................... 327/141

(58) Field of Classification Search
USPC ............................................ 327/141, 144, 145
See application file for complete search history.

(56) References Cited

U.S. PATENT DOCUMENTS

| | | | | |
|---|---|---|---|---|
| 5,256,912 A * | 10/1993 | Rios | | 327/144 |
| 5,548,620 A * | 8/1996 | Rogers | | 375/354 |
| 5,808,486 A | 9/1998 | Smiley | | |
| 5,857,005 A * | 1/1999 | Buckenmaier | | 375/357 |
| 5,905,766 A * | 5/1999 | Nguyen | | 375/354 |
| 5,923,858 A * | 7/1999 | Kanekal | | 710/107 |
| 5,987,081 A * | 11/1999 | Csoppenszky et al. | | 375/354 |
| 6,055,285 A * | 4/2000 | Alston | | 375/372 |
| 6,097,775 A * | 8/2000 | Weber | | 375/354 |
| 6,175,603 B1 * | 1/2001 | Chapman et al. | | 375/354 |
| 6,810,484 B2 * | 10/2004 | Govindaraman | | 713/400 |
| 6,987,404 B2 * | 1/2006 | Duncan | | 327/141 |
| 7,098,706 B1 * | 8/2006 | Pasqualini | | 327/141 |
| 7,236,040 B2 | 6/2007 | Chan et al. | | |
| 7,288,969 B1 | 10/2007 | Sleigh et al. | | |
| 7,366,938 B2 * | 4/2008 | Warren et al. | | 713/400 |
| 7,680,231 B2 * | 3/2010 | Angello et al. | | 375/370 |
| 2005/0036577 A1 * | 2/2005 | Sweet | | 375/354 |
| 2007/0129923 A1 * | 6/2007 | Langer et al. | | 703/13 |
| 2008/0211559 A1 | 9/2008 | Tanaka | | |
| 2008/0265955 A1 * | 10/2008 | Kejriwal | | 327/144 |
| 2009/0323457 A1 * | 12/2009 | Shori | | 365/233.1 |
| 2009/0323875 A1 * | 12/2009 | Kossel | | 375/354 |

* cited by examiner

*Primary Examiner* — William Hernandez
(74) *Attorney, Agent, or Firm* — Rory D. Rankin; Meyertons, Hood, Kivlin, Kowert & Goetzel, P.C.

(57) ABSTRACT

A system and method for synchronizing asynchronous input signals with reliability. Each of a first and a second storage element in a synchronizer receives a first clock signal in a first clock domain. The second storage element may also receive a first reset signal generated by a second clock signal in the first clock domain different from the first clock signal. The first storage element receives a combination of an asynchronous data input signal and the first reset signal. The data input signal may be generated from circuitry utilizing a second clock domain different from the first clock domain. The second storage element additionally receives an output of a second combination of a stored output value of the first storage element and a second reset signal generated from the first clock signal. The second storage element stores a stable output value based at least on the asynchronous data input signal.

25 Claims, 8 Drawing Sheets

SYNCHRONIZER WITH HIGH RELIABILITY

BACKGROUND OF THE INVENTION

1. Field of the Invention

This invention relates to computing systems, and more particularly, to synchronizing asynchronous input signals with high reliability.

2. Description of the Relevant Art

Integrated circuits (ICs) use one or more clocks to synchronize work in a pipelined fashion. Sequential elements, such as latches and flip-flops, receive a data input signal and a clock signal. These sequential elements are used throughout the die of one or more cores to provide synchronized processing of control and data signals. These sequential elements have an associated overhead including a setup time and a hold time.

The setup time is a minimum duration of time prior to a sequential element opening for the data input signal to remain stable. The hold time is a minimum duration of time after the sequential element closes for the data input signal to remain stable. If the setup time is violated, then the data input value may not be stored. If the hold time is violated, then the data input value may be overwritten early. When either the setup or the hold time is violated, the signals within the sequential element and an associated data output line become metastable, or unpredictable. Even if the output value settles to a correct value, more power is consumed by both the sequential element and subsequent combinatorial logic. Additionally, the subsequent combinatorial logic takes more time to perform computations. Further, the subsequent combinatorial logic may provide a wrong result if the output value of the sequential element does not settle to a correct value. The parameter Mean Time Between Failures, or MTBF, indicates an average time interval between two successive failures of a particular element on a chip.

Although an IC design may include timing paths and combinatorial logic between sequential elements to satisfy setup and hold times, violations of setup and hold times may still exist. For example, the sequential elements may receive asynchronous signals. One source of asynchronous signals occurs when synchronous data and control signals are exchanged between different clock domains. The different clock domains may use different clock frequencies. Alternatively, the different clock domains may use a same clock frequency but use an arbitrary phase relation between the clock signals.

System designers include circuitry, such as synchronizers, to minimize metastability. The synchronizers are located at interfaces and include scan input logic, reset or clear logic, recycle stored data capability, gated clock capability, and so forth. This added functionality may decrease the MTBF of the flip-flop, which increases a number of failures and decreases system reliability.

In view of the above, efficient methods and mechanisms for synchronizing asynchronous input signals with high reliability are desired.

SUMMARY OF EMBODIMENTS OF THE INVENTION

Systems and methods for efficiently synchronizing asynchronous input signals with high reliability. In one embodiment, an interface between two clock domains includes a synchronizer. The interface may be placed in an interface unit on a system-on-a-chip (SOC). Alternatively, the synchronizer may be placed within a processor. The synchronizer may include at least two storage elements coupled together in a cascaded manner. Each of the storage elements may receive a first clock signal in a first clock domain. Control logic within the synchronizer may combine an asynchronous data input signal and the first reset signal. The data input signal may be generated from circuitry utilizing a second clock domain different from the first clock domain. The first and the second clock domain may differ by having a different clock frequency, a different clock duty cycle and/or by having a non-zero phase relation between them.

A first storage element may receive a value based on the combination provided by the control logic. A second storage element may receive a first reset signal generated by a second clock signal in the first clock domain different from the first clock signal. The first reset signal may be asserted asynchronously and deasserted synchronously. Despite the first reset signal being generated by the second clock signal, the synchronizer is able to store a stable output value based at least on the asynchronous data input signal.

These and other embodiments will be further appreciated upon reference to the following description and drawings.

Figure 1:
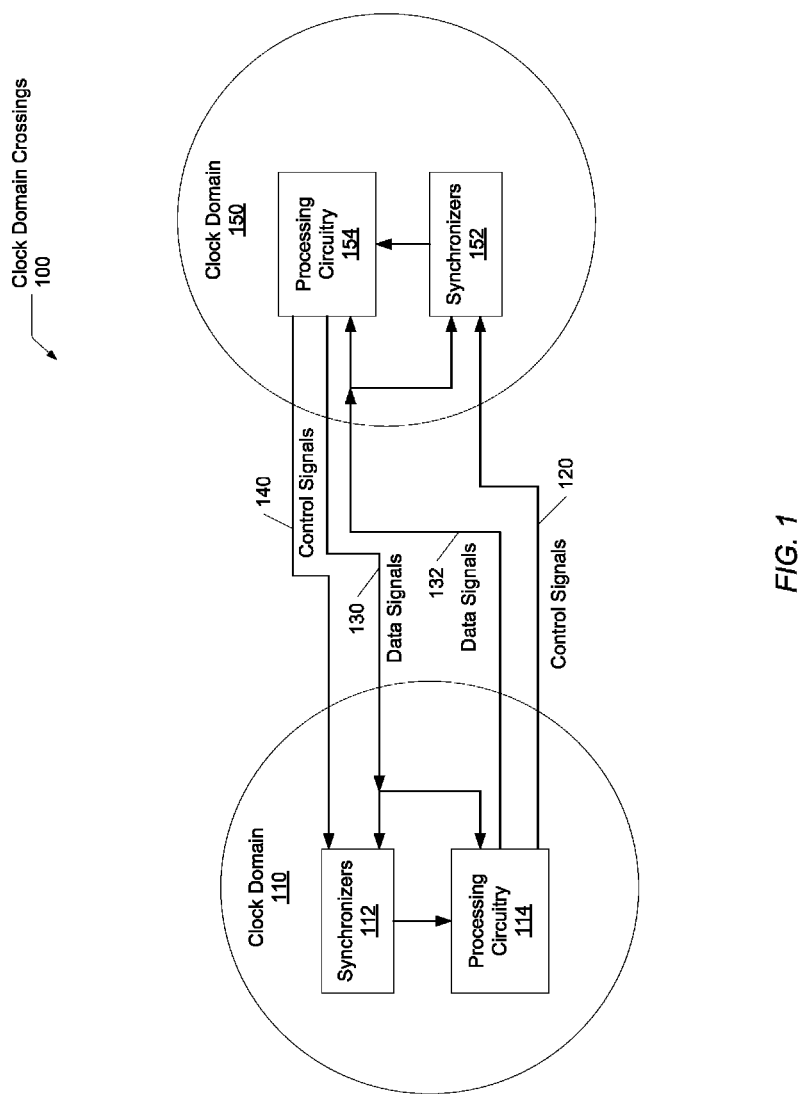
FIG. 1 is a generalized block diagram of one embodiment of clock domain crossings.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring to FIG. 1, a generalized block diagram illustrating one embodiment of clock domain crossings 100 is shown. Each of the clock domains 110 and 150 may determine a manner for synchronizing computational work performed by associated semiconductor circuitry within a specified area on a semiconductor chip. Generally, a clock domain may be characterized by a given clock frequency, a given clock duty cycle, and given rise and fall slopes. Each of the clock domains 110 and 150 may be placed on a same semiconductor die. Alternatively, each of the clock domains 110 and 150 may be placed on separate dies. The clock domains 110 and 150 may use different values for one or more of the clock frequency and the clock duty cycle. Additionally, the clock domains 110 and 150 may use a nonzero phase relation between them.

Each of the clock domains 110 and 150 may include associated processing circuitry 114 and 154, respectively. Each of the processing circuitry 114 and 154 may include combinatorial logic and sequential elements used for the storage of data and control signal values. Data signals 130 and 132 may be conveyed between the clock domains 110 and 150. Each of the processing circuitry 114 and 154 may both receive and send one or more signals within the data signals 130 and 132.

Generally, the control signals 120 and 140 may be used by the processing circuitry 114 and 154 to enable and disable particular operations, such as read and write operations for storage elements. Additionally, the control signals 120 and 140 may be used to change the characteristics of operations, such as selecting particular arithmetic logic unit (ALU) components for execution. Alternatively the control signals 120 and 140 may be used to synchronize the data signals 130 and 132. One or more control signals 120 may be sent from the clock domain 110 to the clock domain 150. Similarly, one or more control signals 140 may be sent from the clock domain 150 to the clock domain 110.

The synchronizers 112 may receive the control signals 140 and one or more of the data signals 130. Similarly, the synchronizers 152 may receive the control signals 120 and one or more of the data signals 132. As described above, there may be differences between the clock domains 110 and 150. These differences may include differences in clock frequencies, differences in clock duty cycles and a nonzero phase relation between the clock domains 110 and 150. These differences may cause metastability in received signals from other clock domains.

An example of conveying signals that cross different clock domains includes interfaces to external systems. Interfaces to external systems provide asynchronous signals to sequential elements. Processor-based systems are coupled to peripheral devices such as keyboards, printers, mice, modems and so forth. Another example is a system-on-a-chip (SOC) that integrates multiple functions into a single integrated chip substrate to meet increasing processing demands of embedded system applications. The functions may include digital, analog, mixed-signal and radio-frequency (RF) functions. The multiple processing cores and computation units on the SOC interact with one another and provide asynchronous input data and control signals to each other.

Metastability of signals within the processing circuitry 114 and 154 may lead to higher power consumption, failed timing paths and possible stored incorrect values. The parameter Mean Time Between Failures, or MTBF, indicates an average time interval between two successive failures of a particular element on a chip. If the clock domain differences cause a sequential element, such as a flip-flop, to be unable to store a correct value for an input signal, then a failure occurs. The synchronizers 112 and 152 may be placed in the clock domains 110 and 150 to reduce metastability and increase reliability. The synchronizers 112 and 152 may attempt to stabilize received signals that violate setup and hold times for sequential elements located within a respective one of the clock domains 110 and 150. However, the synchronizers 112 and 152 are also susceptible to metastability.

Figure 2:
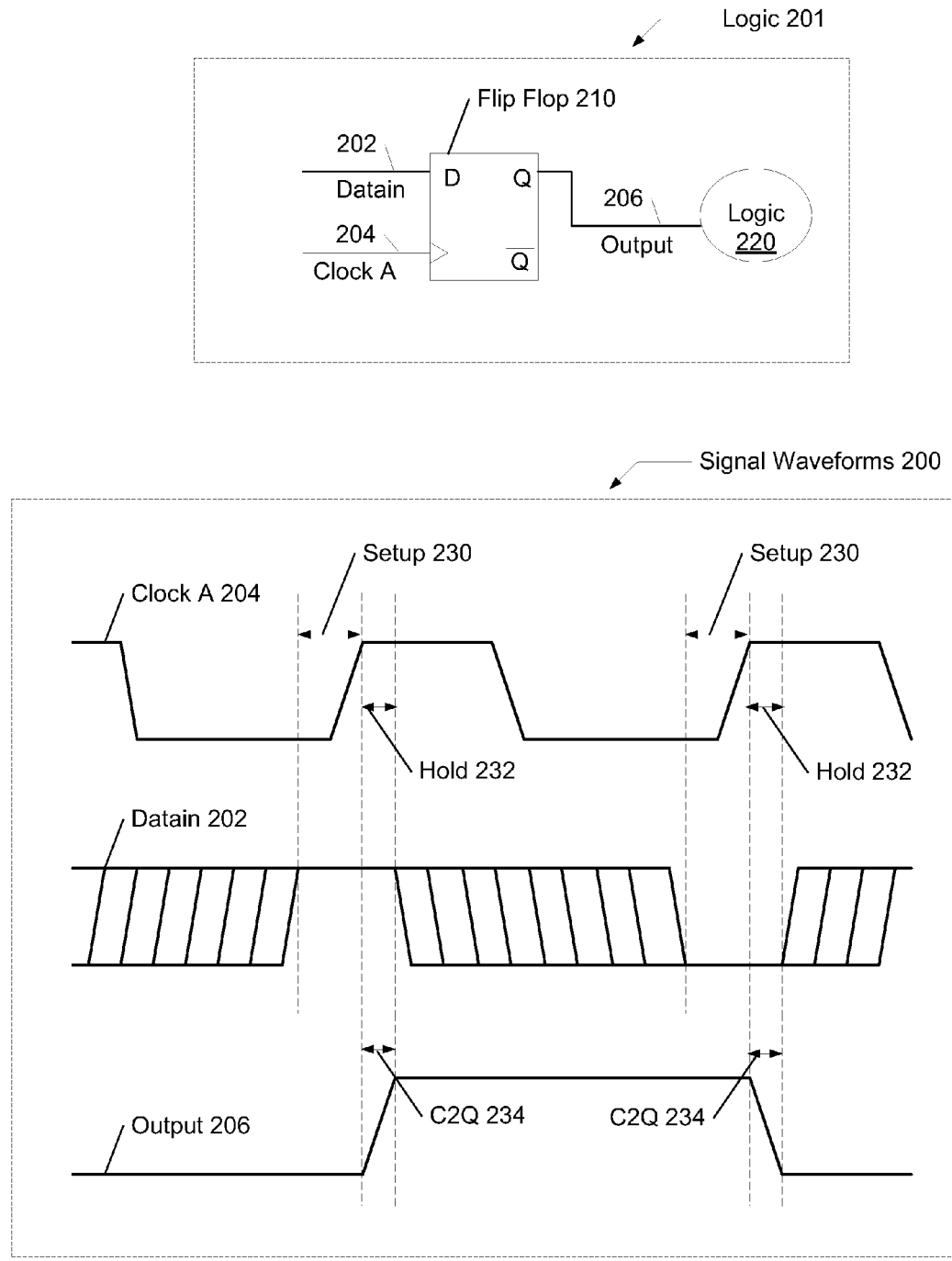
FIG. 2 is a generalized block diagram illustrating one embodiment of logic and signal waveforms for data storage in a sequential element.

Turning now to FIG. 2, a generalized block diagram illustrating one embodiment of logic 201 and signal waveforms 200 for data storage in a sequential element is shown. This embodiment does not include all examples of data storage. For example, a flip-flop circuit may be replaced with a single latch circuit and the combinatorial logic may be replaced with dynamic logic. In addition, the combinatorial logic may be replaced with a memory such as a random access memory (RAM) cell or a register file circuit. The embodiment shown is for a simple illustrative purpose.

In some embodiments, the flip-flop circuit 210 may use a master-slave latch configuration. The flip-flop circuit 210 may also include single or double output lines, and one of many embodiments for feedback circuits and scan circuitry. The line Datain 202 receives a data input signal. The flip-flop circuit 210 receives a clock signal Clock A on the line 204. The flip-flop circuit 210 conveys a data output signal on line 206, which is received by the combinatorial logic 220. The combinatorial logic 220 performs combinatorial computations dependent on the output of flip-flop 210. The output of the combinatorial logic 220 may be sent to other logic or sequential elements, which are not shown for ease of illustration.

One embodiment of the signal waveforms generated on lines 202-206 of flip-flop 210 is shown. Although the storing of data in flip-flop 210 is shown with respect to a rising edge of the clock waveform, the same principles apply if data storage is based on a falling edge of the clock waveform. The flip-flop 210 has a setup time, Setup 230, which specifies the input signal on its input line to remain stable for a minimum duration prior to the rise of the clock signal. In one embodiment, this duration may be defined by the delay of an inverter supplying the inverted input data value to the master transmission-gate within the master-slave configuration used in flip-flop 210. In addition, the minimum duration includes the delay of the master transmission-gate. If the data input signal is not stable for this minimum setup duration prior to the clock rising, then the input data value may not have time to be stored by the master latch within the flip-flop 210. Therefore, timing analysis requires the data input signal be ready a setup time, such as Setup 230, before the clock signal rises.

The flip-flop 210 has a hold time, Hold 232, which specifies the input signal on its input line to remain stable for a minimum duration subsequent the rise of the clock signal. This duration may be defined by the delay of an inverter supplying the inverted input data value to the master transmission-gate and the delay of the master transmission-gate. If the data input signal is not stable for the minimum hold duration subsequent to the clock rising, then the input data value may have time to over-write the required value to be stored by the master latch. As seen here, the data input value may be changing between logic high and low values, but stabilizes at a logic high value during the time window that includes both the Setup time 230 and the Hold time 232. Accordingly, the output line, which begins at a logic low value transitions to a logic high value after the rise of the clock waveform.

Flip-flop 210 may have a clock-to-Q propagation value, C2Q 234, which represents the delay between the time the clock signal rises and the output of flip-flop 210 is present on its output line. This delay may be due to the propagation delay of the slave latch. The delay of the slave latch may include an inverter delay to present an inverted clock signal to the slave latch, the inverter delay to supply the input value to the slave transmission-gate, the delay through the transparent slave transmission-gate, and the inverter output buffer delay. Not all of these delays are accumulated as separate values, since some of the delays may occur simultaneously such as the inverter delay for the clock signal and the inverter delay for the slave latch input.

In the illustrated example, the data input value satisfies the setup and hold times 230 and 232 of the flip-flop 210. Accordingly, the output data value of the flip-flop 210 is stable and correct initially as a logic high value and later as a logic low value when it is sent to the combinatorial logic 220.

Figure 3:
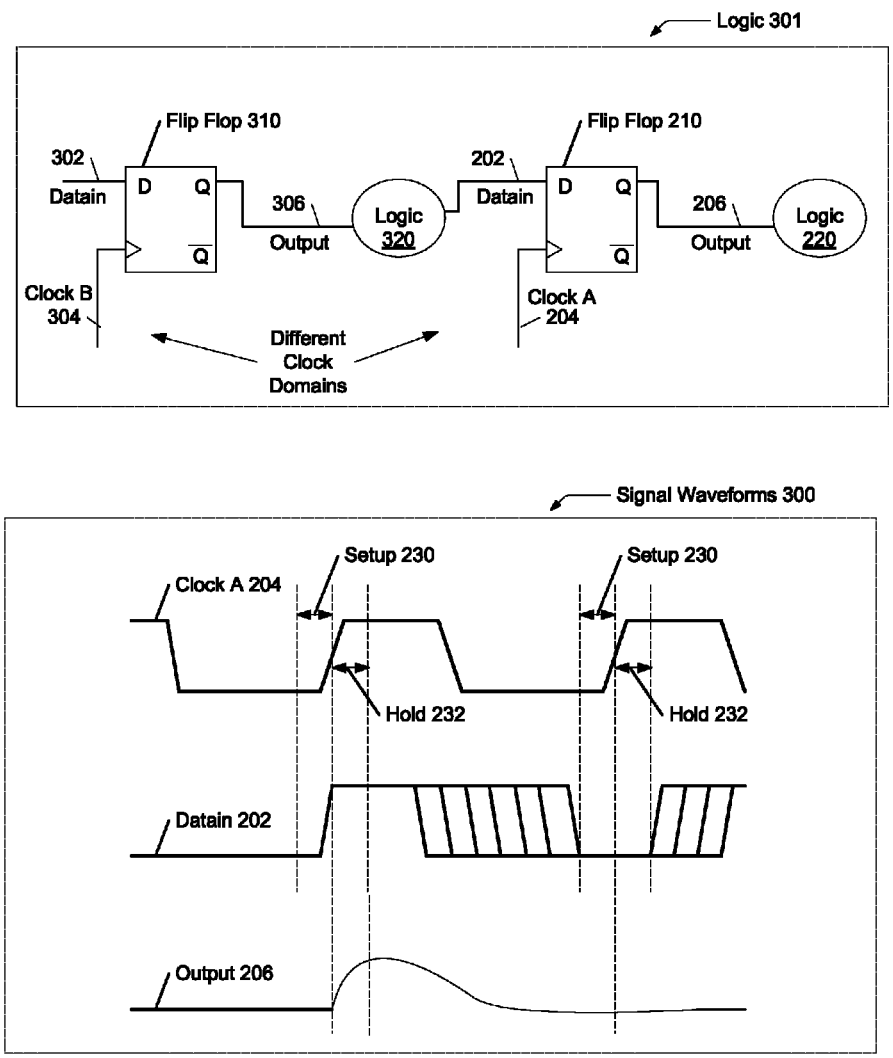
FIG. 3 is a generalized block diagram illustrating another embodiment of logic and signal waveforms for a timing path.

Turning now to FIG. 3, a generalized block diagram illustrating one embodiment of logic 301 and waveforms 300 for a timing path is shown. Circuitry and logic shown here similar to circuitry and logic described above are similarly numbered. In the embodiment shown, flip-flop 310 receives a data input signal on the datain line 302. The flip-flop 310 conveys a data output signal on the output line 306, which is received by the combinatorial logic 320. The output of the combinatorial logic 320 is received by the flip-flop 210 on the datain line 202. The flip-flop 310 also receives a clock signal Clock B on the clock line 304. The clock signal Clock B may be from a different clock domain than the Clock signal Clock A, which is received by the flip-flop 210 on line 204.

A timing path exists between the output of flip-flop 310 and the input of flip-flop 210. Combinatorial logic, Logic 320, receives the output of flip-flop 310, performs combinatorial computations dependent on the output of flip-flop 310, and conveys an output value to the input of flip-flop 210. One embodiment of the signal waveforms generated on lines 202-206 is shown. Again, the clock signal Clock B on line 304 may be from a different clock domain than the clock signal Clock A on line 204. These two clock signals may have a different frequency, may have a different duty cycle and/or may have a nonzero phase relation between them.

As seen here, the data input value on line 202 may have a logic low value prior to the rise of the clock signal Clock A on line 204. A logic high value generated from flip-flop 310 and combinatorial logic 320 may change to a logic high value. However, the rise of the data input value on line 202 occurs after the setup time 230 for the flip-flop 210. Although the data input line remains stable with a logic high value past the hold time 232 for the flip-flop 210, the data output signal violates the time window defined by the setup time 230 and the hold time 232. Accordingly, the data output signal on line 206 reaches a metastable value and settles at an incorrect logic low value. The flip-flop 210 does not have sufficient time to store the logic high value on the datain line 202.

Typically, specifications for storage elements, such as flip-flops, include statistical parameters, which allow system designers to calculate information such as a MTBF value. The MTBF value of a given storage element may indicate a likelihood of a metastable condition occurring in the storage element. Changes to a data input signal for the storage element that occur between associated setup and hold times for the storage element may produce unpredictable stored values within the storage element. Typically, the likelihood of metastability occurring in storage elements is proportional to the clock and data frequency. As the clock frequency increases, the mean time between failures decreases. The number of failures increases when the clock frequency increases.

Figure 4:
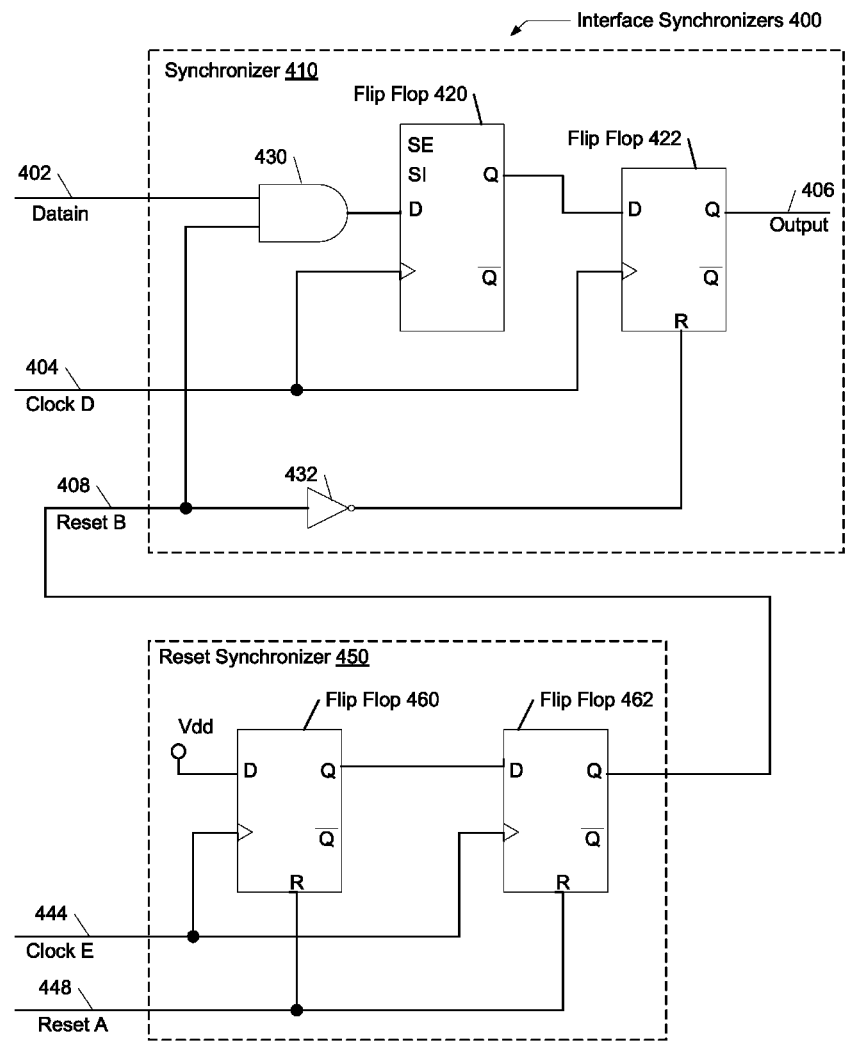
FIG. 4 is a generalized block diagram illustrating one embodiment of interface synchronizers.

Referring now to FIG. 4, a generalized block diagram illustrating one embodiment of interface synchronizers 400 is shown. The interface synchronizers 400 may be placed on an interface of a clock domain for signals that cross clock domains. The interface synchronizers 400 may include a synchronizer 410 for data and/or control signals that cross clock domains. Additionally, the interface synchronizers 400 may include a reset synchronizer 450 used to perform a reset function for the synchronizer 410. A description of the reset synchronizer 450 is provided below followed by a description of the synchronizer 410.

The reset synchronizer 450 may include cascaded flip-flop 460 and 462. The data input of the flip-flop 460 may be connected to a power supply line shown as Vdd here. The output of the flip-flop 460 may be conveyed to the input of the flip-flop 462. Each of the flip-flops 460 and 462 may receive a same clock signal Clock E on the line 444. Each of the flip-flops 460 and 462 may contain reset functionality. In one embodiment, each of the flip-flops 460 and 462 may asynchronously provide a logic low value on their respective output lines when a reset input value is asserted to a logic high value. Therefore, each of the flip-flops 460 and 462 may provide the logic low values despite the signal Clock E on line 444 being at a logic low value.

The reset signal Reset A on line 448 may be received by both flip-flops 460 and 462. This reset signal Reset A provided on line 448 may be generated outside of a respective clock domain for the interface synchronizers 400. The output value generated by the flip-flop 462 may be the output value for the reset synchronizer 450. This output value Reset B may be sent to the reset input line 408 of the synchronizer 410.

The synchronizer 410 may include cascaded flip-flops 420 and 422. Each of the flip-flops 420 and 422 may receive a clock signal Clock D on the line 404. The flip-flop 420 may include scan mode functionality. Accordingly, the flip-flop 420 may include a scan enable input and a scan data input. The lines for these signals are not shown for ease of illustration. Similar to the flip-flops 460 and 462, the flip-flop 422 includes may contain reset functionality. In one embodiment, the flip-flop 422 may asynchronously provide a logic low value on its output line 406 when a reset input value is asserted to a logic high value. Therefore, the flip-flop 422 may provide the logic low value despite the signal Clock D on line 404 being at a logic low value.

Unlike the flip-flops 422 and 460-462, the flip-flop 420 may not contain reset functionality within itself. The added transistors and wire routing used to provide reset functionality within the flip-flop 420 may increase the time window determined by respective setup and hold times for the flip-flop 420. The added transistors and wire routes for reset functionality may affect the slave latch portion of the master-slave configuration within the flip-flop 420. As the time window increases, the probability of a data input signal violating this time window also increases. As this probability increases, the Mean Time Between Failures (MTBF) decreases. Accordingly, reliability of an associated computing system that includes the synchronizer 410 decreases. Referring again to FIG. 3, it can be seen as the time window determined by the setup time 230 and the hold time 232 increases, the probability of an asynchronous data input signal changing within this time window increases. Therefore, the flip-flop 420 may not contain reset functionality within itself in order to increase both an associated MTBF value and reliability of an associated computing system.

The data input of the synchronizer 410 may be an asynchronous data or control signal provided by processing circuitry in another clock domain. This asynchronous data or control signal may be provided on the datain line 402. This data or control signal may be generated in a separate clock domain from a clock domain that generates the clock signals Clock D and Clock E on lines 404 and 444, respectively. Although the clock signals Clock D and Clock E are generated within a same clock domain and therefore have a same clock frequency, a same clock duty cycle and have a zero phase relation between them, they may be physically different signals. In fact, the clock signals Clock D and Clock E may be turned on and turned off at different times with respect to one another. Further details regarding these clocks signals is provided shortly.

The data or control signal on the datain line 402 may be combined by combinatorial logic with the reset signal Reset B on line 408. The output of this combinatorial logic may be sent to the data input of the flip-flop 420. In one embodiment, the combinatorial logic is a binary logic AND gate 430. The data output of the flip-flop 420 may be sent to the data input of the flip-flop 422. The flip-flop 422 may receive an inverted value of the reset signal Reset B on line 408 due to the inverter 432. The reset synchronizer 450 is reset by the external reset signal Reset A being asserted to a logic high value and being provided on line 448. As a result, the reset synchronizer 450 provides a logic low value for Reset B on the line 408. The flip-flop 422 receives a logic high value on its reset input line due to the inverter 432. Accordingly, the flip-flop 422 asynchronously provides a logic low value on its output line 406.

Although each of the flip-flops 422, 460 and 462 has been described to provide an asynchronous logic low value on their respective output lines when an asynchronous reset value is asserted to a logic high value on their respective reset lines, other combinations of logic values are possible and contemplated. In addition, the combinatorial logic 430 may change based on the chosen combination. The synchronizer 410 and the reset synchronizer 450 may provide a high MTBF value for an interface connecting two different clock domains. However, if the clock signals Clock D on line 404 and Clock E on line 444 may be turned on and off at different times with respect to one another, the synchronizer 410 and the reset synchronizer may cause logic failures. If the clock signals Clock D on line 404 and Clock E on line 444 may be turned on and off at a same time with respect to one another, then the interface synchronizers 400 may be used for synchronizing asynchronous input signals with high reliability while also providing correct logic verification results.

Figure 5:
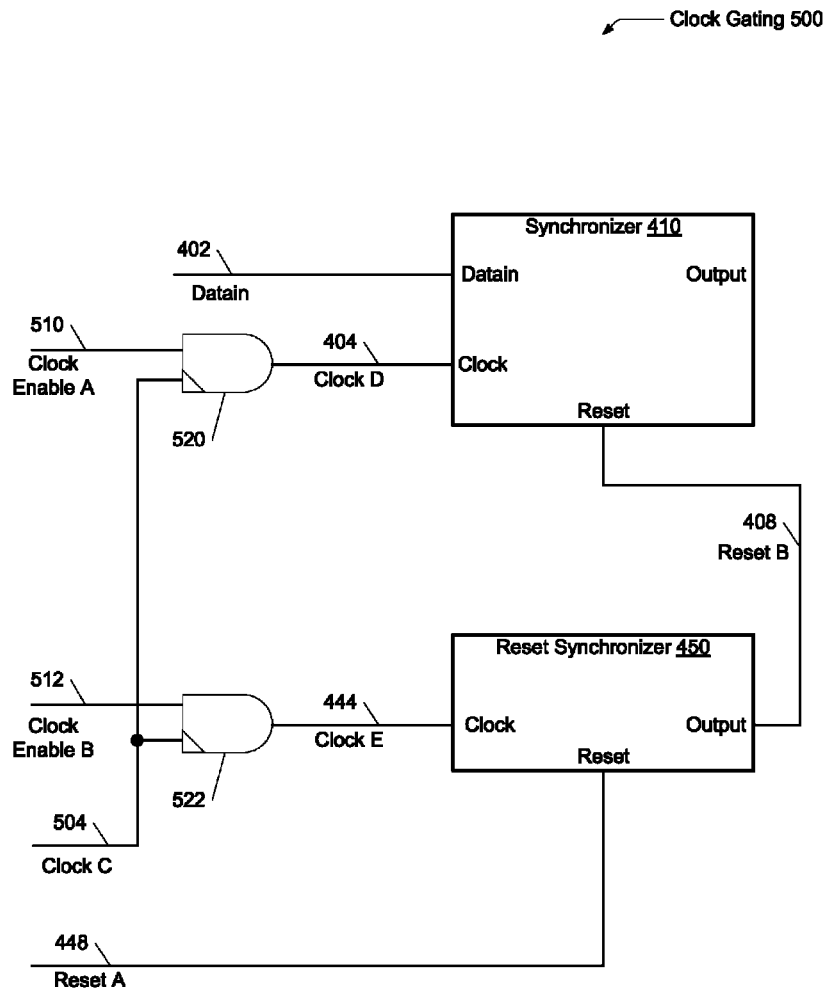
FIG. 5 is a generalized block diagram illustrating another embodiment of clock gating for sequential elements.

Referring now to FIG. 5, a generalized block diagram illustrating one embodiment of clock gating 500 is shown. Circuitry, logic and values described earlier are numbered here identically. Here, the synchronizer 410 and the reset synchronizer 450 are connected to each other as described earlier.

A clock signal Clock C on line 504 may be generated within a same clock domain used for the synchronizers 410 and 450. The clock signal Clock C may be sent to each of the clock enabled buffers 520 and 522. The clock enable signal Clock Enable A on line 510 may be sent to the clock enabled buffer 520. The clock enabled buffer 520 may combine the clock enable signal on line 510 and the clock signal Clock C with binary AND logic. Therefore, the output of the buffer 520 on line 404 may be similar to the clock signal Clock C on line 504 with some delay when the clock enable signal Clock Enable A on line 510 is asserted to a logic high value. Similarly, the clock enable signal Clock Enable B on line 512 may be sent to the clock enabled buffer 522. The clock enabled buffer 522 may combine the clock enable signal on line 512 and the clock signal Clock C on line 504 with binary AND logic. Therefore, the output of the buffer 522 on line 444 may be similar to the clock signal Clock C with some delay when the clock enable signal Clock Enable B on line 512 is asserted to a logic high value.

In one embodiment, the clock enable signals on lines 510 and 512 may be asserted at different times. Although there may be overlaps in time when both clock enable signals on lines 510 and 512 are asserted, the resulting clock signals Clock D on line 404 and Clock E on line 444 may have windows of time when they do not have a same value. In one embodiment, the clock enable signals on lines 510 and 512 are generated by logic external to a computing system within a clock domain used by the synchronizers 410 and 450. Therefore, in one example, the clock signal Clock D on line 404 may be running while the clock signal Clock E on line 444 is not running.

The flip-flops 422 and 460-462 within the synchronizers 410 and 450 have a reset input signal that is asserted asynchronously and deasserted synchronously. However, the flip-flop 420 within the synchronizer 410 has a reset functionality that is both asserted and deasserted synchronously. The flip-flop 420 within the synchronizer 410 may change the output of the flip-flop 422 although the logic of the reset signal Reset A on line 448 and the disabled running clock E on line 444 does not produce a change. Therefore, a logic high value may be propagated to the output of the synchronizer 410 by the flip-flop 420 when a reset logic low value is expected.

Figure 6:
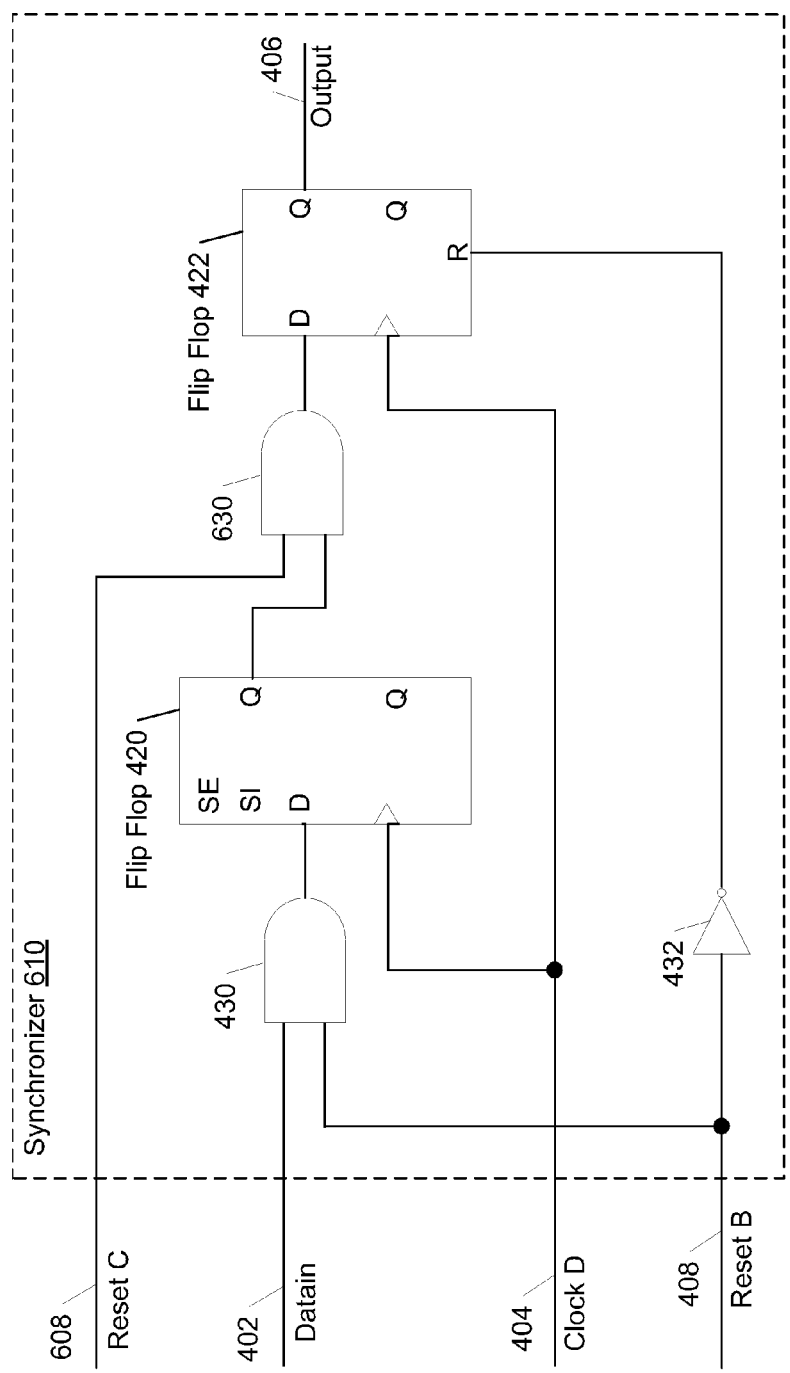
FIG. 6 is a generalized block diagram illustrating another embodiment of interface synchronizers.

Turning now to FIG. 6, a generalized block diagram of another embodiment of a data or control interface synchronizer 610 is shown. Circuitry, logic and values described earlier are numbered here identically. The synchronizer 610 may be used in place of the earlier synchronizer 410 when the clock signals Clock D and Clock E on lines 404 and 444 are not enabled by a same clock enable signal.

The synchronizer 610 may include combinatorial logic between the flip-flops 420 and 422. The output of the flip-flop 420 may be combined with an external reset signal Reset C on line 608. The output of this combinatorial logic may be sent to the data input of the flip-flop 422. In one embodiment, the combinatorial logic is a binary logic AND gate 630. In the embodiment shown, when the reset signal Reset C on line 608 is deasserted to a logic low value, the flip-flop 422 receives a logic low value on its data input regardless of the output value provided by the flip-flop 420. Similar to the combinatorial logic 430 described above, the combinatorial logic 630 may change based on the chosen combination of logic values for both input and output reset values for the flip-flop 422.

Figure 7:
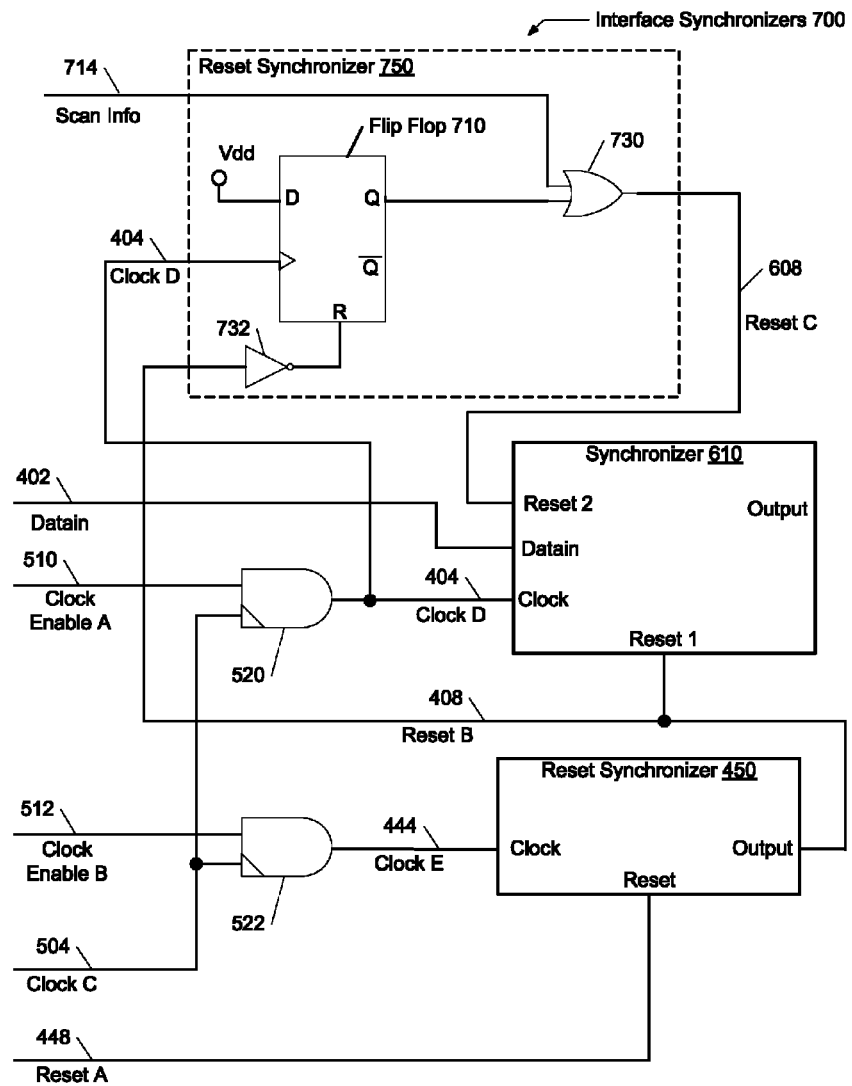
FIG. 7 is a generalized block diagram illustrating yet another embodiment of interface synchronizers.

Turning now to FIG. 7, a generalized block diagram illustrating another embodiment of interface synchronizers 700 is shown. Circuitry, logic and values described earlier are numbered here identically. The interface synchronizers 700 may be placed on an interface of a clock domain for signals that cross different clock domains. The interface synchronizers 700 may include a synchronizer 610 for data and/or control signals that cross different clock domains. Additionally, the interface synchronizers 700 may include a reset synchronizer 450 used to perform a reset function for the synchronizer 610. Further, the interface synchronizers 700 may include a reset synchronizer 750 used to perform an additional reset function for the synchronizer 610.

The reset synchronizer 450 may be connected as described earlier. The synchronizer 610 may be connected in a similar manner as the synchronizer 410 described earlier, except an additional reset input named Reset 2 receives the reset signal Reset C on line 608. The reset synchronizer 750 provides this additional reset signal. The reset synchronizer 750 may include a flip-flop 710. The data input of the flip-flop 710 may be connected to a power supply line shown as Vdd here. Similar to the synchronizer 610, the flip-flop 710 within the reset synchronizer 750 may receive the generated clock signal Clock D on line 404. Therefore, the reset synchronizer 750 and the synchronizer 610 each receive a same generated clock signal Clock D on line 404 that is controlled by the same clock enable signal Clock Enable A on line 510. Although the flip-flop 420 within the synchronizer 610 is reset synchronously, the reset signal Reset C on line 608 allows the synchronizer 610 to be reset asynchronously and maintain its reset value while the reset signal Reset A on line 448 is asserted. The synchronizer 610 is able to maintain its reset value on its output line despite possible changes on the output of the flip-flop 420 when the clock signal Clock D on line 404 rises.

In one embodiment, the output of the flip-flop 710 within the reset synchronizer 750 may be conveyed to the input of combinatorial logic 730. The combinatorial logic 730 may combine scan test data with the output of the flip-flop 710. The output of this combinatorial logic may be sent as the output of the reset synchronizer 750. In one embodiment, the combinatorial logic is a binary logic OR gate. In another embodiment, the scan test data is not sent to the reset synchronizer 750 and the output of the flip-flop 710 is sent directly as the output of the reset synchronizer 750.

The flip-flop 710 may receive an inverted value of the reset signal Reset B on line 408 due to the inverter 732. As described earlier, in one embodiment, the reset synchronizer 450 is reset by the external reset signal Reset A being asserted to a logic high value and being provided on line 448. As a result, the reset synchronizer 450 provides a logic low value for Reset B on the line 408. The flip-flop 710 receives a logic high value on its reset input line due to the inverter 732. Accordingly, the flip-flop 710 asynchronously provides a logic low value on its output line 608. The output signal, Reset C, on line 608 is received by the synchronizer 610 on its second reset input, Reset 2.

Similar to the flip-flops 422, 460 and 462, the flip-flop 710 has been described to provide an asynchronous logic low value on its respective output line when an asynchronous reset value is asserted to a logic high value on its respective reset line. However, other combinations of logic values are possible and contemplated. In addition, the combinatorial logic 730 may change based on the chosen combination. The interface synchronizer 700 may provide a high MTBF value for an interface connecting two different clock domains despite a reset function utilizes a generated clock signal different than another generated clock signal utilized by a data or control signal synthesizer.

Figure 8:
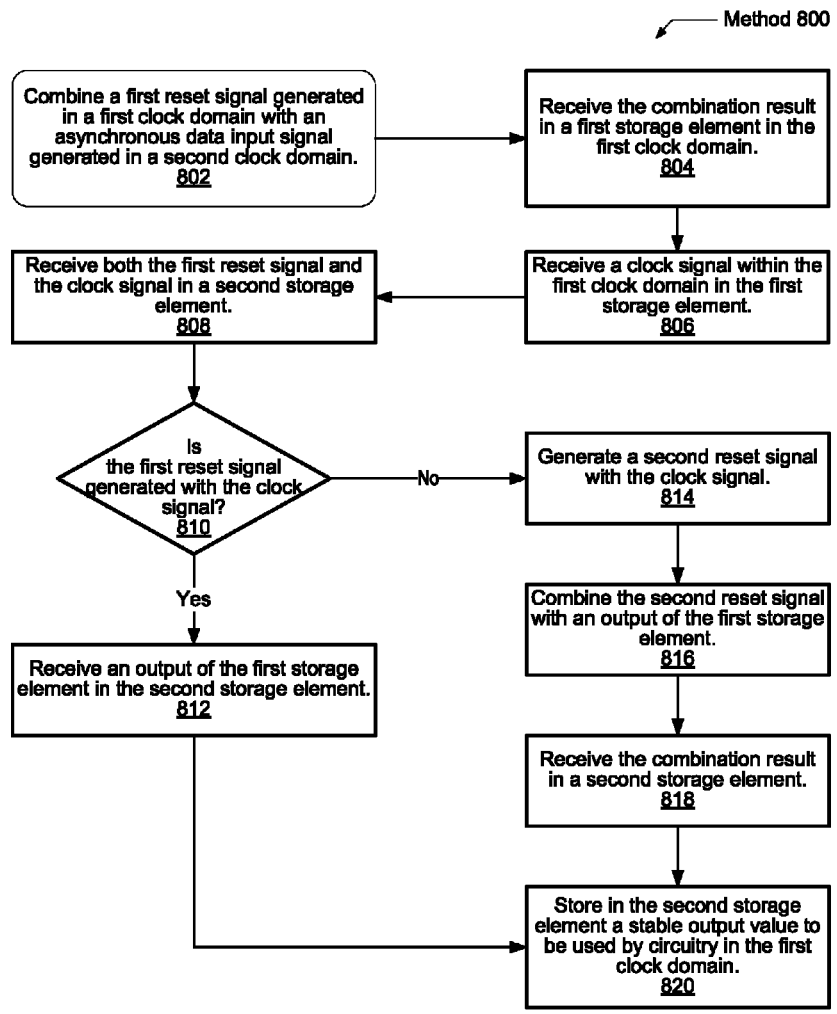
FIG. 8 is a generalized flow diagram illustrating one embodiment of a method for providing stable signal values that cross different clock domains.

Turning now to FIG. 8, one embodiment of a method 800 for providing stable signal values that cross different clock domains is shown. For purposes of discussion, the steps in this embodiment and subsequent embodiments of methods described later are shown in sequential order. However, in other embodiments some steps may occur in a different order than shown, some steps may be performed concurrently, some steps may be combined with other steps, and some steps may be absent.

In block 802, a first reset signal is combined with an asynchronous data input signal. The combination may utilize binary logic. The first reset signal may be generated in a first clock domain. The data input value may be generated in a second clock domain. The second clock domain may differ from the first clock domain in a clock frequency or a clock duty cycle. In addition, the second clock domain may have a nonzero phase relation with the first clock domain. A binary combination of the first reset signal and the data input signal may depend on whether a binary logic high value or low value is chosen for an asserted reset value. In one embodiment, the first reset signal is asynchronously asserted, but it is synchronously deasserted based on a clock signal within the first clock domain. The data input value may be a data operand value or a control signal.

In block 804, a first storage element within the first clock domain receives a result of the combination. In block 806, the first storage element also receives a clock signal within the first clock domain. In block 808, a second storage element receives both the first reset signal and the clock signal. If the first reset signal is generated with the clock signal (conditional block 810), then in block 812, the second storage element receives an output of the first storage element.

The first reset signal may be generated by a different clock signal than one received by each of the first and the second storage elements. For example, separate clock enabled buffers may provide separated clock signals to be used by reset generation logic and by the first and the second storage elements. In block 820, the second storage element stores a stable output value to be used by circuitry in the first clock domain.

If the first reset signal is not generated with the clock signal (conditional block 810), then in block 814, a second reset signal is generated with the clock signal. For example, an output of a same clock enabled buffer used for supplying the clock signal to each of the first and the second storage elements may be used to generate the second reset signal. In block 816, the second reset signal may be combined with an output of the first storage element. In block 818, the second storage element receives an output of this combination. Control flow of method 800 then moves from block 818 to block 820.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:
1. A synchronizer comprising:
a first storage element configured to receive a first clock signal in a first clock domain;

a second storage element coupled to the first storage element, wherein the second storage element is configured to receive the first clock signal and a first reset signal; and control logic configured to combine an asynchronous data input signal and the first reset signal, wherein the data input signal is generated from circuitry utilizing a second clock domain different from the first clock domain;

wherein the first storage element is configured to receive a value based on the combination; and wherein the second storage element is configured to store a stable output value based at least on the asynchronous data input signal.

2. The synchronizer as recited in claim 1, wherein the first reset signal is an output of a reset synchronizer comprising two cascaded flip-flops, wherein each of the two flip-flops receives a second clock signal in the first clock domain different from the first clock signal.

3. The synchronizer as recited in claim 2, wherein the first reset signal is asserted asynchronously and deasserted synchronously.

4. The synchronizer as recited in claim 3, wherein providing the first and the second clock signal comprises:
a first gated clock buffer configured to generate the first clock signal from a third clock signal in the first clock domain by utilizing a first clock enable signal; and
a second gated clock buffer configured to generate the second clock signal from the third clock signal by utilizing a second clock enable signal different from the first clock enable signal.

5. The synchronizer as recited in claim 3, wherein the control logic is further configured to generate a second combination with a stored output value of the first storage element and a second reset signal.

6. The synchronizer as recited in claim 5, wherein the second storage element is configured to receive a value based on the second combination.

7. The synchronizer as recited in claim 6, wherein the second reset signal is asserted asynchronously and deasserted synchronously.

8. The synchronizer as recited in claim 7, wherein the second reset signal is an output of a single flip-flop configured to receive both the first clock signal and the first reset signal.

9. A method comprising:
receiving in a first storage element a first clock signal in a first clock domain;
receiving in a second storage element both the first clock signal and a first reset signal;
combining an asynchronous data input signal and the first reset signal, wherein the data input signal is generated from circuitry utilizing a second clock domain different from the first clock domain;
receiving in the first storage element a value based on the combination; and
storing in the second storage element a stable output value based at least on the asynchronous data input signal.

10. The method as recited in claim 9, further comprising generating the first reset signal with a second clock signal in the first clock domain different from the first clock signal.

11. The method as recited in claim 10, further comprising asserting asynchronously the first reset signal and deasserting synchronously the first reset signal.

12. The method as recited in claim 11, further comprising:
generating the first clock signal from a third clock signal in the first clock domain by utilizing a first clock enable signal; and generating the second clock signal from the third clock signal by utilizing a second clock enable signal different from the first clock enable signal.

13. The method as recited in claim 11, further comprising generating a second combination with a stored output value of the first storage element and a second reset signal.

14. The method as recited in claim 13, further comprising receiving in the second storage element receive a value based on the second combination.

15. The method as recited in claim 14, further comprising asserting asynchronously the second reset signal and deasserting synchronously the second reset signal.

16. The method as recited in claim 15, further comprising generating the second reset signal from both the first clock signal and the first reset signal.

17. An apparatus comprising:
a first clock line configured to receive a first clock signal in a first clock domain;
a reset line configured to receive a first reset signal;
a data line configured to receive an asynchronous data input signal generated from circuitry utilizing a second clock domain different from the first clock domain;
control logic configured to combine the data input signal and the first reset signal; and
cascaded storage elements;
wherein a first storage element of the cascaded storage elements is configured to receive a value based on the combination; and
wherein a second storage element of the cascaded storage elements is configured to store a stable output value based at least on the asynchronous data input signal.

18. The apparatus as recited in claim 17, wherein the first reset signal is generated from a second clock signal in the first clock domain different from the first clock signal.

19. The apparatus as recited in claim 18, wherein the first reset signal is asserted asynchronously and deasserted synchronously.

20. The interface unit as recited in claim 19, wherein the second clock domain differs from the first clock domain in at least one of the following: a clock frequency, a clock duty cycle, and a nonzero phase relation.

21. The apparatus as recited in claim 19, wherein the second storage element is further configured to receive a combination of a stored output value of the first storage element and a second reset signal, wherein the second reset signal is generated from the first clock signal.

22. An interface within a processor comprising:
a first clock line configured to receive a first clock signal in a first clock domain;
a data line configured to receive an asynchronous data input signal generated from circuitry utilizing a second clock domain different from the first clock domain;
a reset line configured to receive a first reset signal generated by the first clock signal;
control logic configured to combine the data input signal and the first reset signal;
cascaded storage elements, wherein at least a first storage element of the cascaded storage elements does not include reset functionality; and
wherein the cascaded storage elements are configured to:
receive a value based on the combination performed by the control logic; and
store a stable output value based at least on the asynchronous data input signal.

23. The processor as recited in claim 22, wherein the first reset signal is generated from a second clock signal in a first clock domain different from the first clock signal.

24. The processor as recited in claim 23, wherein the first reset signal is asserted asynchronously and deasserted synchronously.

25. The processor as recited in claim 24, wherein a second storage element of the cascaded storage elements is configured to receive a combination of a stored output value of the first storage element and a second reset signal, wherein the second reset signal is generated from the first clock signal.

* * * * *